United States Patent [19]
Bult et al.

[11] Patent Number: 5,285,171
[45] Date of Patent: Feb. 8, 1994

[54] HIGH OUTPUT IMPEDANCE AMPLIFIER

[75] Inventors: Klaas Bult; Godefridus J. G. M. Geelen, both of Eindhoven, Netherlands

[73] Assignee: U. S. Philips Corporation, New York, N.Y.

[21] Appl. No.: 922,300

[22] Filed: Jul. 30, 1992

[30] Foreign Application Priority Data

Jul. 30, 1991 [EP] European Pat. Off. ......... 91201969.2

[51] Int. Cl.[5] .............................................. H03K 3/16
[52] U.S. Cl. ..................................... 330/277; 330/296
[58] Field of Search ................... 307/491, 497, 296.1, 307/296.8; 330/277, 288, 296, 311

[56] References Cited

U.S. PATENT DOCUMENTS

| | | | |
|---|---|---|---|
| 4,697,153 | 9/1987 | Lish | 330/277 |
| 5,039,954 | 8/1991 | Bult et al. | 330/277 |

*Primary Examiner*—Steven Mottola
*Attorney, Agent, or Firm*—Bernard Franzblau

[57] ABSTRACT

An amplifier arrangement comprises a first transistor (N1) having a control electrode coupled to an input terminal for receiving an input signal (Vin), a first main electrode coupled to a first supply-voltage terminal (2), and having a second main electrode. A second transistor (N2) has a control electrode, a first main electrode coupled to the second main electrode of the first transistor, and a second main electrode coupled to a second supply-voltage terminal (3) by means of a current source (J1). An output terminal supplies an output signal (Vout). An amplifier (N4, N5) has an inverting input (V1) coupled to the second main electrode of the first transistor, and an output (V0) coupled to the control electrode of the second transistor. An apparatus (N3, N6, N7, N8, P1, P2, P3, P4) is provided for correcting a first potential on the second main electrode of the first transistor depending upon a second potential on the control electrode of the first transistor in a manner such that the first transistor is operated at a desired point of saturation.

23 Claims, 2 Drawing Sheets

HIGH OUTPUT IMPEDANCE AMPLIFIER

BACKGROUND OF THE INVENTION

This invention relates to an amplifier arrangement comprising a first transistor having a control electrode coupled to an input terminal for receiving an input signal, having a first main electrode coupled to a first supply-voltage terminal, and having a second main electrode, a second transistor having a control electrode, having a first main electrode coupled to the second main electrode of the first transistor, and having a second main electrode coupled to an output terminal for supplying an output signal, and a control amplifier having an inverting input coupled to the second main electrode of the first transistor, and having an output coupled to the control electrode of the second transistor.

Such an amplifier arrangement can be used in general for amplifying a signal in integrated semiconductor circuits.

Such an amplifier arrangement is known inter alia from European Patent Application EP-A 0,397,240, which corresponds to U.S. Pat. No. 5,039,954 Aug. 13, 1991. The known amplifier arrangement amplifies an input signal applied to the input terminal so as to obtain an output signal on the output terminal, the control amplifier maintaining a substantially constant potential on the second main electrode of the first transistor. As a result of the substantially constant potential the known amplifier arrangement can provide a high gain, although in some cases the output impedance and hence the internal gain of the amplifier arrangement are too low, which is a disadvantage.

SUMMARY OF THE INVENTION

It is an object of the invention to provide an amplifier arrangement having a very high output impedance and a high internal gain.

It is another object of the invention to provide an amplifier arrangement which has an optimum dynamic range and/or forms a very compact device in comparison with the prior art.

An amplifier arrangement in accordance with the invention is characterised in that the amplifier arrangement further comprises correction means for correcting a first potential on the second main electrode of the first transistor depending upon a second potential on the control electrode of the first transistor, a manner such that in operation the first transistor is kept at a desired point of saturation. The invention is based on the recognition of the fact that in order to realise a very high output impedance the first potential on the second main electrode of the first transistor should be dependent on the second potential of a signal source coupled to the input terminal, i.e. the potential on the control electrode of the first transistor, to such an extent that the first transistor is kept at the same desired point of saturation. As the correction means couple the first potential on the second main electrode of the first transistor to the second potential on the control electrode of the first transistor, the first transistor will be operated at a desired point of saturation depending on the input signal applied to the input terminal, yielding a maximum gain and a maximum output signal swing.

A first embodiment of an amplifier arrangement in accordance with the invention may be characterised in that the correction means comprise adaption means and a current-sensing circuit (N3) for generating a current related to a current through the first transistor (N1), the adaptation means being driven by means of the current generated by the sensing circuit to adapt the first potential.

The proposed embodiment corrects the first potential dependent upon variations of the current through the first transistor which are caused by variations of the second potential on the input terminal.

A second embodiment of an amplifier arrangement in accordance with the invention is characterised in that the correction means comprise a current-mirror circuit (P1, P2, P3) for generating a current related to a current through the first transistor (N1), the adaptation means (N6, N7, N8) being driven by means of said current generated by the current-mirror circuit (P1, P2, P3) to adapt the first potential.

A third embodiment of an amplifier arrangement in accordance with the invention is characterised in that the adaptation means (N6, N7, N8) comprise at least one transistor (N6) which in combination with the first transistor (N1) forms a current path between the first and a second supply voltage terminal, which current path is supplied with current from an output (P3) of the current mirror (P1, P2, P3), the first transistor (N1) and said transistors of the adaptation means being of the same conductivity type.

BRIEF DESCRIPTION OF THE DRAWING

The above and other (more detailed) features of the invention will now be described and explained more elaborately with reference to the accompanying drawings, in which.

DESCRIPTION OF THE PREFERRED EMBODIMENTS

Figure 1:
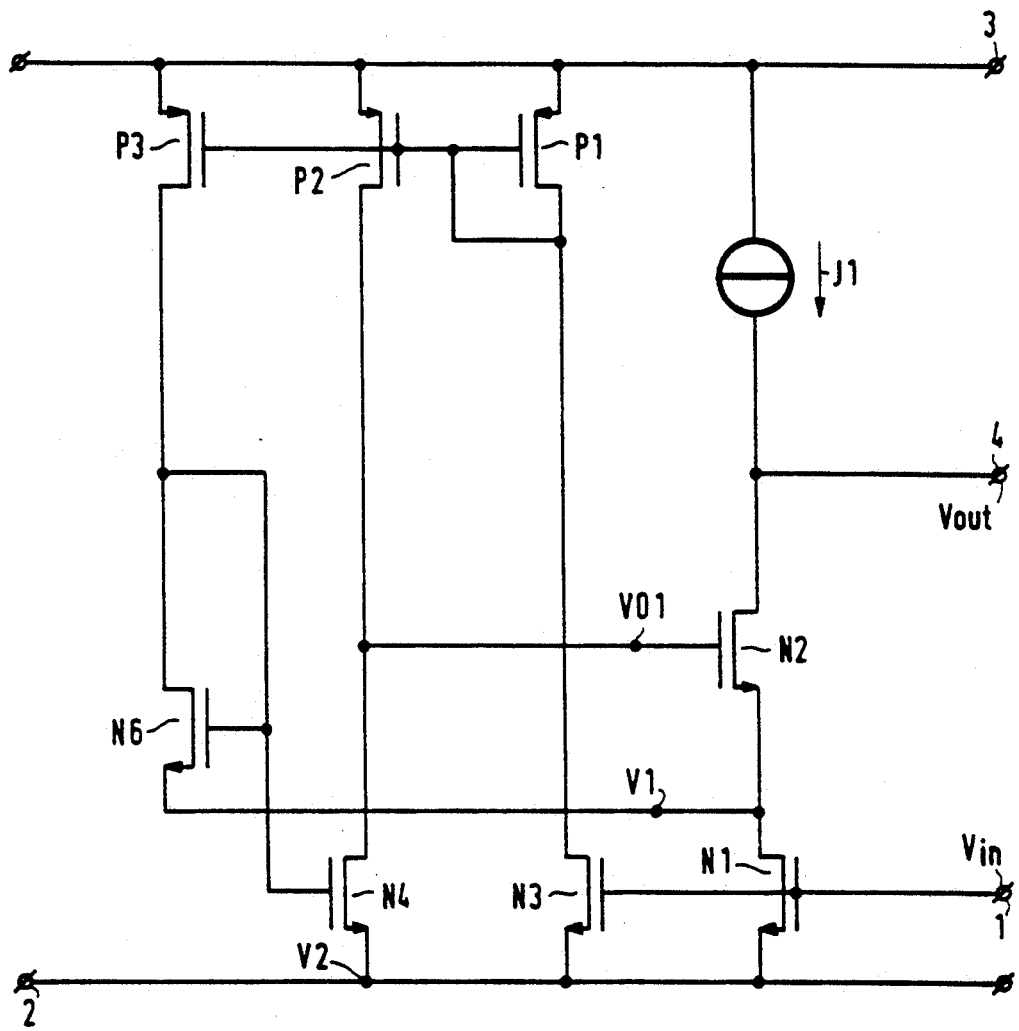
FIG. 1 shows an embodiment of an amplifier arrangement in accordance with the invention, the amplifier arrangement comprising a simple control amplifier.

FIG. 1 shows an embodiment of an amplifier arrangement in accordance with the invention, comprising a simple control amplifier. The relevant amplifier arrangement comprises a first transistor N1, a second transistor N2, and a control amplifier (N4), the transistor N1 having a control electrode (gate) coupled to an input terminal 1 for receiving an input signal Vin, a first main electrode (source) coupled to a first supply-voltage terminal 2, and a second main electrode (drain). The transistor N2 has a control electrode (gate), a first main electrode (source) coupled to the drain of the transistor N1, and a second main electrode (drain) coupled to a second supply-voltage terminal 3 via a current source J1 and to an output terminal 4 for supplying an output signal Vout. The control amplifier (N4) comprises an inverting input V1 coupled to the drain of the transistor N1, a non-inverting input V2 (in fact the source of the transistor N3) coupled to the supply-voltage terminal 2 for receiving a reference voltage, and an output VO1 coupled to the control electrode (gate) of the transistor N2. The amplifier arrangement further comprises correction means for varying a first potential on the drain of the transistor N1 depending on variations of a second potential on the gate of the transistor N1. The correction means comprise a current-sensing circuit (transistor N3), a current-mirror circuit (P1, P2, P3), and adaptation means (N6) for adapting the first potential. In the present embodiment the gates of the transistors N3 and N1 are interconnected, the sources of these transistors also being connected to one another. Therefore, the current through the transistor N3 is related (proportional) to the current through the transistor N1. The drain of the transistor N3 is connected to the drain of a PMOS transistor P1 of the current mirror P1, P2 and P3. The PMOS transistors P1, P2 and P3 have their sources connected to the supply-voltage terminal 3 and their gates connected to each other, the drain of the transistor P1 being connected to the gate of this transistor.

A variation (for example increase) of the current through the transistor N1 results in the transistor N3 and the current mirror P1, P2 and P3 causing a similar current variation (increase). The variation of the current through the transistor P2 influences the control amplifier transistor N4. The variation of the current through the transistor P3 influences the adaptation means in the form of the transistor N6. The drain of the transistor N1 is connected to the source of the diode-connected transistor N6 via the inverting input of the control amplifier (N4). The first potential on the drain of the transistor N1 is now determined by the difference in source-gate voltage differences of the transistors N4 and N6:

$$V1 = |V_{GS\,N4}| - |V_{GS\,N6}|$$

By selecting the length-width ratio of the transistor N4 to be 3 to 9 times, preferably ≈5 times, as large as the length-width ratio of the transistor N6, it is achieved that the first potential V1 is dependent on the second potential, i.e. the input voltage Vin on the gate of the transistor N1, to such an extent that the transistor N1 operates just at the desired "edge" of saturation.

The L/W ratios of the transistors P3, P2, P1 are a factor of 2 to 3 larger than the L/W ratios of the transistors N3 and N4.

Figure 2:
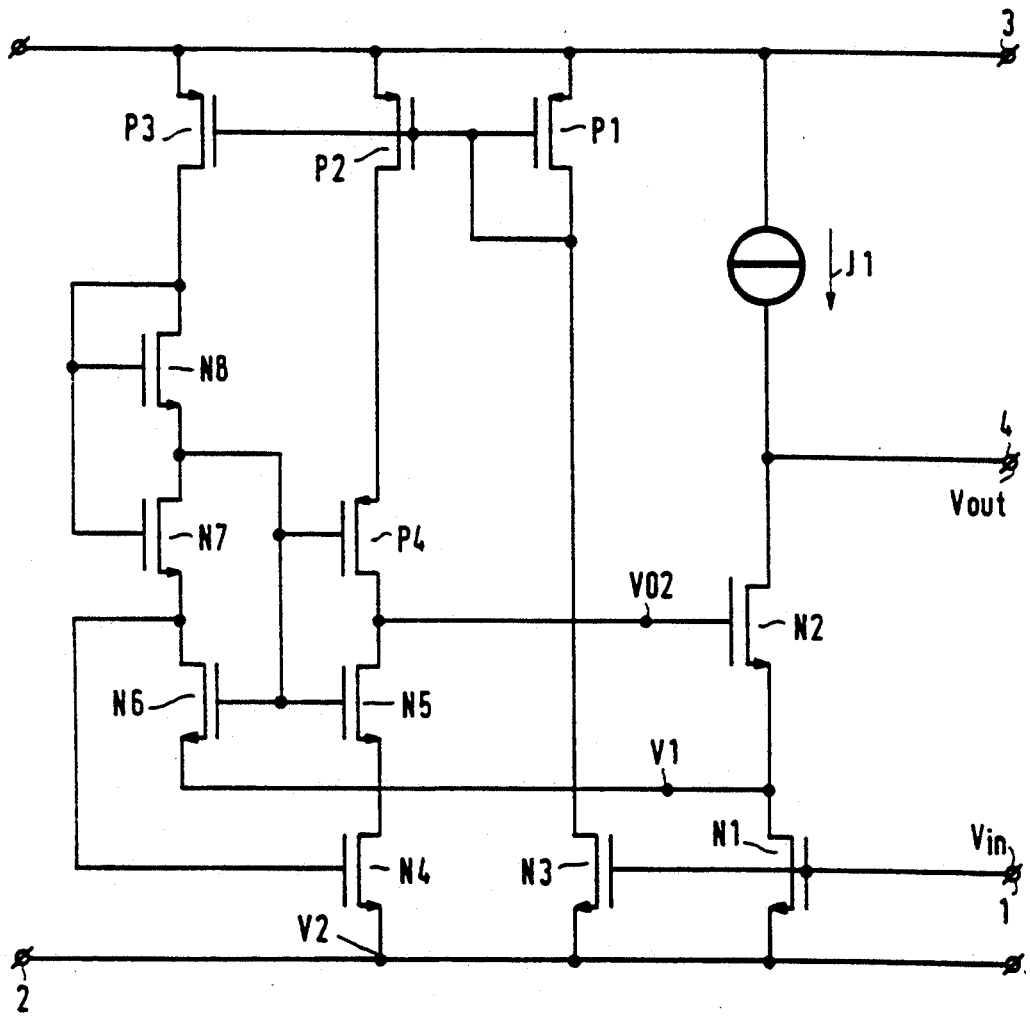
FIG. 2 shows a further embodiment of an amplifier arrangement in accordance with the invention, the amplifier arrangement comprising a cascoded control amplifier.

FIG. 2 shows a further embodiment of an amplifier arrangement in accordance with the invention, comprising a cascoded control amplifier.

The embodiment shown in FIG. 2 comprises a large number of components similar to the components shown in FIG. 1. For this reason these components bear the same references. The relevant components are also connected (to each other) in the same way unless stated otherwise.

A series connection of a P-MOS transistor P4 and an N-MOS transistor N5 is arranged between the drain of the transistor N4 and the drain of the transistor P2, the drain of the transistor N4 and P2 being connected to the source of the transistor N5 and P4, respectively. The drain of the transistor N5 and P4 are connected to one another and to the gate of the transistor N2. The drain of the transistor N6 and P3 are connected to the source of the transistor N7 and the drain of the transistor N8, respectively. The drain of the transistor N7 and the source of the transistor N8 are connected to one another and to the gates of the transistors N6, N5 and P4. The gate of the transistor N4 is connected to the drain of the transistor N6. The gates of the transistors N7 and N8 are connected to the drain of the transistor N8.

The control amplifier (N4) in FIG. 1, which generates the voltage VO1 by means of its current-source section (=the transistor P2), is now formed by cascoding the transistors N5 and N4 and the transistors P2 and P4 and supplies a voltage VO2. The transistors N4, N5 and P4 are suitably biassed by means of the current branch comprising the transistors N1, N6, N7 and N8.

The operation of the arrangement in FIG. 2 is substantially the same as that of the arrangement in FIG. 1. A variation of the current through the transistor N1 now also gives rise to a similar variation of the current through the transistors N3, P1, P2 and P3. However, in the present case the length-width ratio of the transistors N3, N4, N5 and N6, N8 is the same whereas the length-width ratio of the transistor N7 is larger (3 to 9× and preferably 5× as large) than the length-width ratio of the transistor N8.

The first potential V1 on the drain of the transistor N1 is now defined by:

$$V1 = |V_{GS\,N4}| + |V_{GS\,N7}| - |V_{GS\,N8}| - |V_{GS\,N6}|$$

The arrangements shown in FIGS. 1 and 2 can be used as electronic modules. The arrangements in effect operate as a fictitious N-MOS transistor yielding an intrinsic gain (gm. ro) of more than 85 dB. The input terminal 1 is the connection for the gate of this transistor, the terminal 2 and the output terminal 4, respectively, constituting the source and the drain of this transistor.

An additional advantage of these arrangements is that they do not require external bias voltages, i.e. from outside the arrangements, which facilitates integration of the arrangements and simplifies the combination of a plurality of such arrangements in an IC. It is to be noted that the IC area for the transistors N3 to N8 and P1 to P4 is only 20% of the area of the transistors N1 and N2, thereby enabling such a fictitious transistor to be of a very compact construction.

The invention is not limited to the embodiments shown herein. Within the scope of the invention several modifications are conceivable to those skilled in the art. For example, the transistors shown in the Figures can be replaced by transistors of an opposite conductivity type, yielding a fictitious P-MOS transistor, and the individual parts of the amplifier arrangement can be constructed in several ways. A plurality of such fictitious P-MOS and N-MOS transistors can be integrated on one substrate so that these fictitious P-MOS and N-MOS transistors can be combined to form circuit arrangements in much the same way as normal P-MOS and N-MOS transistors which are known per se.

We claim:

1. An amplifier arrangement comprising: a first transistor having a control electrode coupled to an input terminal for receiving an input signal (Vin), having a first main electrode coupled to a first supply-voltage terminal, and having a second main electrode, a second transistor having a control electrode, having a first main electrode coupled to the second main electrode of the first transistor, and having a second main electrode coupled to an output terminal for supplying an output signal (Vout), and a control amplifier having an inverting input (V1) coupled to the second main electrode of the first transistor, and having an output (VO) coupled to the control electrode of the second transistor, and a correction means for correcting a first potential on the second main electrode of the first transistor depending upon a second potential on the control electrode of the first transistor in a manner such that in operation the first transistor is kept at a desired point of saturation.

2. An amplifier arrangement as claimed in claim 1, wherein the correction means comprise adaptation means and a current-sensing circuit for generating a current related to a current through the first transistor, the adaptation means being driven by means of a current generated by the sensing circuit thereby to adapt the first potential.

3. An amplifier arrangement as claimed in claim 2, wherein the correction means comprise a current-mirror circuit for generating a current related to a current through the first transistor, the adaptation means being driven by means of said current generated by the current-mirror circuit to adapt the first potential.

4. An amplifier arrangement as claimed in claim 3, wherein the adaptation means comprise at least one transistor which in combination with the first transistor forms a current path between the first and a second supply voltage terminal, which current path is supplied with current from an output of the current mirror, the first transistor and said at least one transistor of the adaptation means being of the same conductivity type.

5. An amplifier arrangement as claimed in claim 4, wherein the control amplifier is supplied with current from a further output of the current mirror.

6. An amplifier arrangement as claimed in claim 2, wherein the control amplifier comprises a transistor having a first main electrode connected to the first supply-voltage terminal, a second main coupled to the output (VO), and a control coupled to the second main electrode of the first transistor via a diode-connected transistor of the adaptation means.

7. An amplifier arrangement as claimed in claim 3, wherein the adaptation means comprise three series-connected transistors which, in combination with the first transistor, form a current path between the first supply-voltage terminal and a second supply-voltage terminal, which current path is supplied with current from an output of the current mirror, the first transistor and said series-connected transistors being of the same conductivity type, a first series transistor being connected to the output of the current mirror and being connected as a diode, a control electrode of a second series transistor being connected to a control electrode of the first series transistor, a control electrode of the third between the main electrodes of the first and the second series transistor, and a node between the main electrodes of the second and the third series transistor being coupled to the inverting input of the control amplifier.

8. An amplifier arrangement as claimed in claim 7, wherein the control amplifier comprises a cascoded amplifier having a first and a second amplifier transistor of a first conductivity type and a first and a second amplifier transistor of a second conductivity type which form a current path between the first and the second supply-voltage terminal, a node between the second transistors of a different conductivity type forming the output (VO) of the control amplifier, control electrodes of the second transistors of the control amplifier being connected to the control electrode of the third series transistor, and a main electrode and the control electrode of the just amplifier transistor of the first conductivity type being connected to the first supply-voltage terminal and the inverting input, respectively, of the control amplifier.

9. An amplifier arrangement as claimed in claim 3, wherein the current-sensing circuit comprises a current-sensing transistor of the same conductivity type as the first transistor, a first main electrode and a control electrode of the current-sensing transistor being connected respectively to the first main electrode and the control electrode of the first transistor.

10. An amplifier arrangement as claimed in claim 9, wherein a second main electrode of the current-sensing transistor is connected to a first main electrode of a first current-mirror transistor having its second main electrode connected to a second supply-voltage terminal and its control electrode connected to its first main electrode.

11. An amplifier arrangement as claimed in claim 10, wherein the current mirror comprises three current-mirror transistors whose second and third current-mirror transistor feed a current proportional to the current through the current-sensing transistor into the current path of the adaptation means and the control amplifier, respectively.

12. An amplifier arrangement as claimed in claim 1, wherein the correction means comprise a current-mirror circuit for generating a current related to a current through the first transistor, and means for supplying said current generated by the current-mirror circuit to the first transistor so as to correct the first potential.

13. An amplifier arrangement as claimed in claim 3, wherein the control amplifier is supplied with current from an output of the current mirror.

14. An amplifier arrangement as claimed in claim 3, wherein the control amplifier comprises a transistor having a first main electrode connected to the first supply-voltage terminal, a second main electrode coupled to the output, and a control electrode coupled to the second main electrode of the first transistor via a diode-connected transistor of the adaptation means.

15. An amplifier arrangement as claimed in claim 4, wherein the control amplifier comprises a transistor having a first main electrode connected to the first supply-voltage terminal, a second main electrode coupled to the output, and a control electrode coupled to the second main electrode of the first transistor via a diode-connected transistor of the adaptation means.

16. An amplifier arrangement as claimed in claim 4, wherein the adaptation means comprise three series-connected transistor which, in combination with the first transistor, form a current path between the first supply-voltage terminal and a second supply-voltage terminal, which current path is supplied with current from an output of the current mirror, the first transistor and said series-connected transistors being of the same conductivity type, a first series transistor being connected to the output of the current mirror and being connected as a diode, a control electrode of a second series transistor being connected to a control electrode of the first series transistor, a control electrode of the third series transistor being connected to a node between the main electrodes of the first and the second series transistor, and a node between the main electrodes of the second and the third series transistor being connected to the inverting input of the control amplifier.

17. An amplifier arrangement as claimed in claim 2, wherein the current-sensing circuit comprises a current-sensing transistor of the same conductivity type as the first transistor, a first main electrode and a control electrode of the current-sensing transistor being connected respectively to the first main electrode and the control electrode of the first transistor.

18. An amplifier arrangement comprising:

an input terminal for receiving an input signal, first and second transistors connected in series between first and second supply voltage terminals, means coupling a control electrode of the first transistor to said input terminal and one main electrode of the second transistor to a signal output terminal of the amplifier arrangement, a control amplifier having an input coupled to a common node between the first and second transistors and having an output coupled to a control electrode of the second transistor, and correction means coupled to the first transistor for correcting a first voltage on said common node as a function of a second voltage at the control electrode of the first transistor in a manner such that the first transistor is maintained at a desired point of saturation.

19. An amplifier arrangement as claimed in claim 18 wherein the correction means comprise:

a current sensing circuit coupled to said first transistor for deriving a current related to a current through the first transistor, and adaptation means coupled to the current sensing circuit and to the control amplifier whereby the adaptation means is responsive to said related current so as to correct the first voltage to maintain the first transistor at said desired point of saturation.

20. An amplifier arrangement as claimed in claim 19 wherein said control amplifier comprises a control transistor having an output electrode coupled to the control electrode of the second transistor via said output of the control amplifier, and said adaptation means comprise a rectifier means coupled between said input of the control amplifier and a control electrode of said control transistor.

21. An amplifier arrangement as claimed in claim 18 wherein said correction means comprise:

a current mirror circuit coupled to the first transistor and having an output for deriving a current related to a current through the first transistor, and means for supplying said current generated by the current mirror circuit to the first transistor so as to correct the first voltage.

22. An amplifier arrangement as claimed in claim 21 wherein said current supplying means comprises an adaptation circuit including at least one transistor coupled to the output of the current mirror circuit and to the first transistor, the first transistor and the at least one transistor being of the same conductivity type, and wherein the current mirror circuit comprises a further output for supplying a further current to said control amplifier.

23. An amplifier arrangement as claimed in claim 18 further comprising a current source connected in series with the first and second transistors between the first and second supply voltage terminals.

* * * * *

UNITED STATES PATENT AND TRADEMARK OFFICE
CERTIFICATE OF CORRECTION

PATENT NO. : 5,285,171
DATED : February 8, 1994
INVENTOR(S) : Klaas Bult, et al

It is certified that error appears in the above-indentified patent and that said Letters Patent is hereby corrected as shown below:

Claim 7, column 5, line 45, after "third" insert --series transistor being connected to a node--.

Claim 8, column 5, line 62, change "just" to --first--.

Signed and Sealed this

Twenty-seventh Day of September, 1994

Attest:

BRUCE LEHMAN

Attesting Officer

Commissioner of Patents and Trademarks